(12) United States Patent
Ball et al.

(10) Patent No.: US 7,564,666 B2
(45) Date of Patent: Jul. 21, 2009

(54) SHUNT PROTECTION CIRCUIT AND METHOD THEREFOR

(75) Inventors: Alan R. Ball, Gilbert, AZ (US); Stephen P. Robb, Fountain Hills, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 224 days.

(21) Appl. No.: 11/416,506

(22) Filed: May 2, 2006

(65) Prior Publication Data

US 2007/0258176 A1 Nov. 8, 2007

(51) Int. Cl.
*H02H 3/20* (2006.01)
*H02H 9/04* (2006.01)

(52) U.S. Cl. .................. 361/91.5; 361/91.6

(58) Field of Classification Search ........... 361/91.5
See application file for complete search history.

(56) References Cited

U.S. PATENT DOCUMENTS

| 4,300,061 | A | 11/1981 | Mihalich et al. |
| 4,929,884 | A | 5/1990 | Bird et al. |
| 5,631,187 | A | 5/1997 | Phipps et al. |
| 5,914,501 | A * | 6/1999 | Antle et al. ............. 257/99 |
| 6,064,249 | A * | 5/2000 | Duvvury et al. .......... 327/314 |
| 6,204,715 | B1 * | 3/2001 | Sellnau et al. ............ 327/309 |
| 6,385,060 | B1 | 5/2002 | Basso et al. |
| 6,458,632 | B1 | 10/2002 | Song et al. |
| 6,633,063 | B2 | 10/2003 | Robb et al. |
| 7,265,952 | B2 * | 9/2007 | Chiang et al. ............ 361/8 |

OTHER PUBLICATIONS

"Two-Terminal Transient Suppressor," IP.COM Publication Feb. 3, 2003, IPCOM000010946D, 6 pps.
"ESD5Z2.5T1 Series Transient Voltage Suppressors", data sheet, Nov. 2005—Rev. 4, Semiconductor Components Industries, LLC, 4pps.
"Electrical Design Considerations for SuperFlux LEDs," application brief AB20-3, Copyright 2002 Lumileds Lighting, publication AB20-3 (Sep. 2002), 37 pps.

* cited by examiner

*Primary Examiner*—Albert W Paladini
*Assistant Examiner*—Dharti Patel
(74) *Attorney, Agent, or Firm*—Robert F. Hightower

(57) ABSTRACT

In one embodiment, a protection device is used to protect a circuit. The protection device has a maximum rated power dissipation that is less than a maximum rated power dissipation of the circuit that is being protected.

19 Claims, 5 Drawing Sheets

US 7,564,666 B2

SHUNT PROTECTION CIRCUIT AND METHOD THEREFOR

BACKGROUND OF THE INVENTION

The present invention relates, in general, to electronics, and more particularly, to methods of forming semiconductor devices and structure.

In the past, the electronics industry utilized light emitting diodes (LEDs) for various applications. Improvements in the LEDs improved the efficiency and increased the light emitting capabilities of the LEDs and led to increased applications. In some of the applications, several LEDs were connected together in series in order to provide a higher intensity light output. In such applications, if one of the LEDs failed in an open circuit condition, current could no longer flow to the remaining LEDs, thus, there was no light created by any of the LEDs. In some cases, a zener diode was connected in parallel with each LED to provide an alternate current path when the LED became an open circuit. The zener diode had a reverse voltage or zener voltage that was greater than the forward voltage of the LED so that the zener diode was not conducting current while the LED was operating, although some leakage current may have flowed through the zener diode. If the LED failed and became an open circuit, the zener diode became forward biased and began conducting the current that would be conducted by the LED. Because the zener diode had a higher voltage drop than the LED and conducted the same amount of current, the zener diode had to have a higher power dissipation capability than the LED in order to prevent damaging the zener diode. For example, an LED generally had a forward voltage of approximately 3 to 4 V. Consequently, the parallel connected zener diode had to have a reverse voltage that was greater than 3 to 4 V. Typically, the reverse voltage of the zener diode was much higher in order to minimize leakage current through the zener diode while the LED was operating normally. Thus, the zener diode generally had a reverse voltage of 6 to 8 V which required the zener diode to have a maximum rated power dissipation that was approximately twice the maximum rated power dissipation of the LED. The higher power dissipation generally increased the cost of the LED system. Additionally, the higher voltage drop across the zener diode limited the number of LEDs that could fail and still keep the remaining LEDs operating.

Accordingly, it is desirable to have a protection circuit that has an operating voltage drop that is no greater than the forward voltage of the LEDs, and that has a lower cost.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
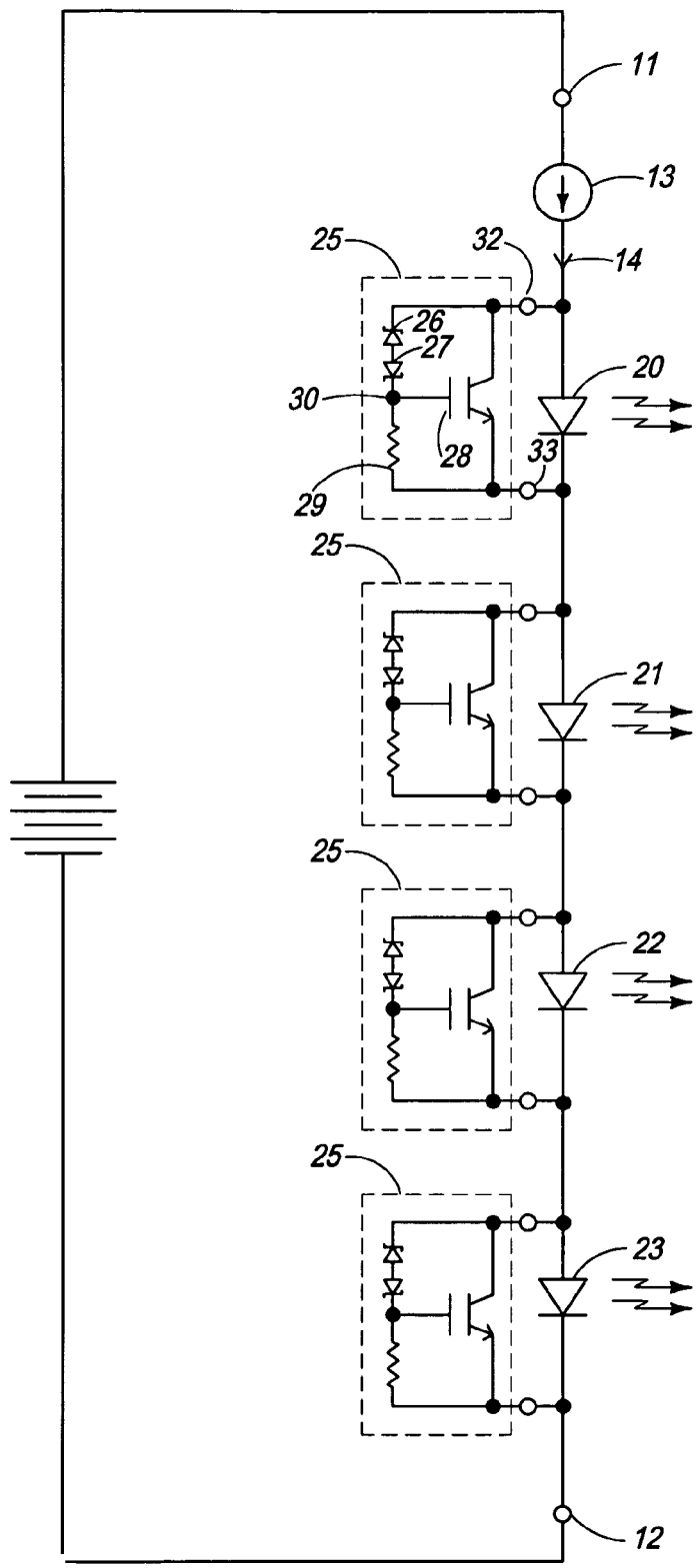
FIG. 1 schematically illustrates an embodiment of a portion of an LED system having a shunt protection circuit in accordance with the present invention.

FIG. 1 schematically illustrates a portion of an embodiment of a light emitting diode (LED) lighting system 10 that includes a shunt protection circuit 25. System 10 typically includes a plurality of LEDs, such as LEDs 20-23, that are connected in series in order to provide a desired light intensity or pattern of light. System 10 generally receives a DC voltage, such as from a battery or other DC power source, between a power input 11 and a power return 12. Return 12 usually is connected to a common return potential such as ground. A current source 13 is coupled to receive power from input 11 and generate a constant current 14 that flows through all of LEDs 20-23.

Shunt protection circuit 25 is configured to provide an alternate current flow path around any of LEDs 20-23 that fails in an open circuit condition. Circuit 25 is a two terminal semiconductor device having a first terminal 32 and a second terminal 33 that facilitate connecting circuit 25 in parallel with any of LEDs 20-23. Circuit 25 includes a pair of back-to-back diodes 26 and 27, a resistor 29, and an MOS gated SCR 28.

Figure 2:
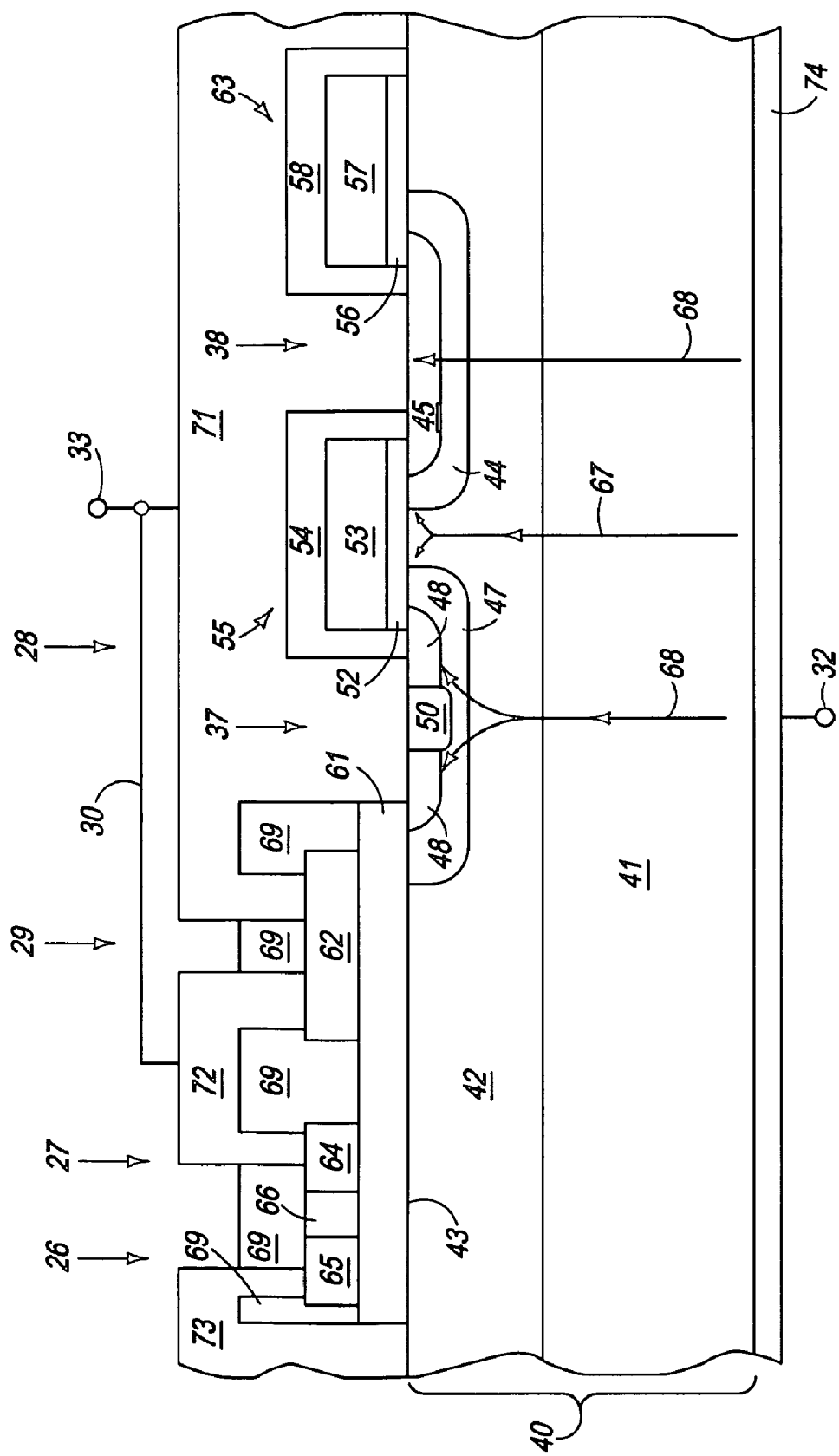
FIG. 2 illustrates an enlarged cross-sectional view of a portion of the shunt protection circuit of FIG. 1 in accordance with the present invention.

FIG. 2 illustrates an enlarged cross-sectional view of an embodiment of a portion of circuit 25 explained in the description of FIG. 1.

Figure 3:
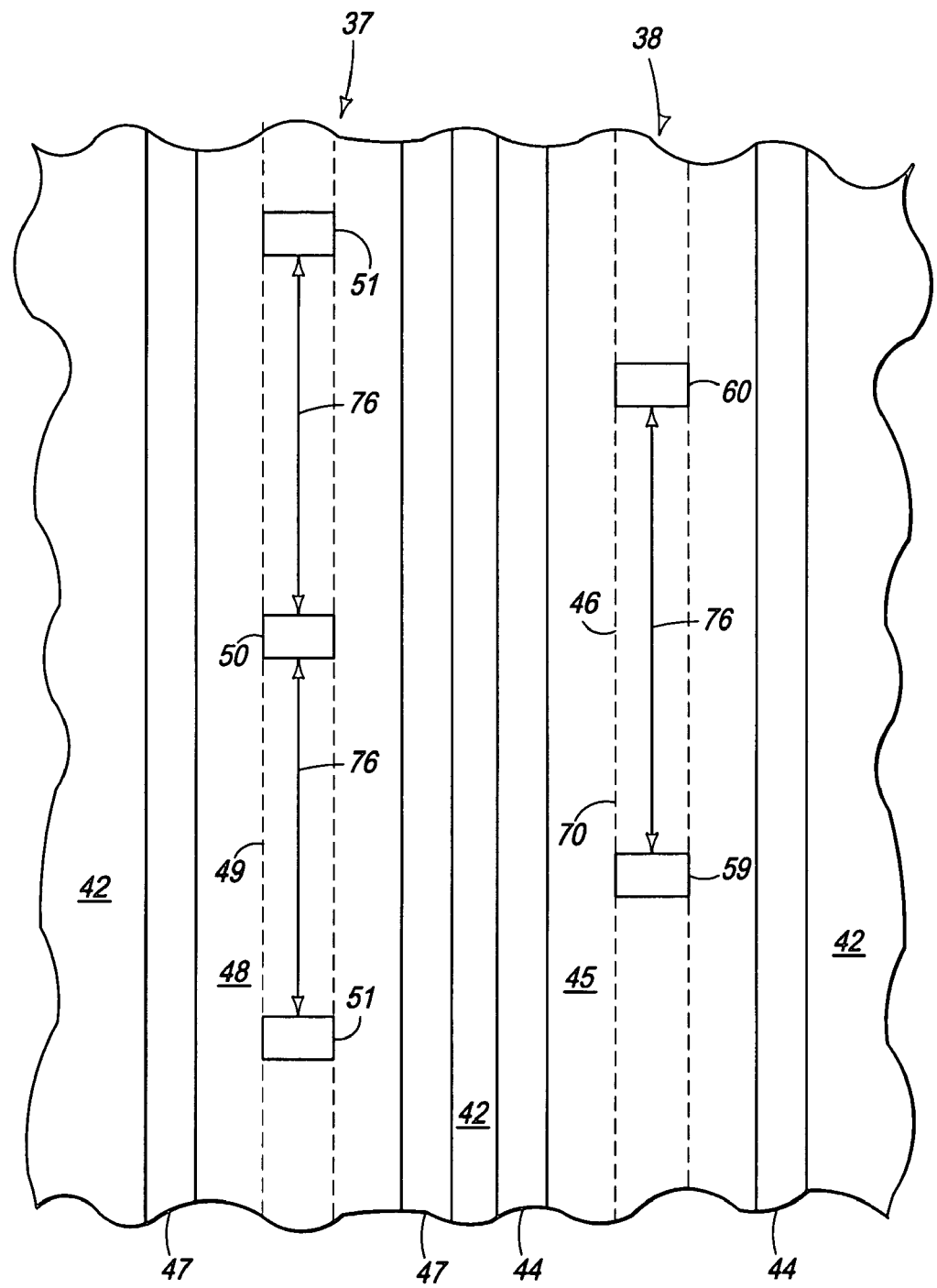
FIG. 3 illustrates an enlarged plan view of a portion of the shunt protection circuit of FIG. 1 in accordance with the present invention.

FIG. 3 illustrates an enlarged plan view of an embodiment of a portion of MOS gated SCR 28 of circuit 25. This description has references to FIG. 1, FIG. 2, and FIG. 3.

Diodes 26 and 27, resistor 29, and MOS gated SCR 28 are formed on a semiconductor substrate 40. Substrate 40 generally includes a bulk semiconductor substrate 41 that has an epitaxial layer 42 formed on a surface of bulk semiconductor substrate 41. Substrate 40 has a first surface 43 and also has a second surface having a conductor material 74 formed thereon to provide electrical contact to terminal 32. In the preferred embodiment, substrate 41 is a heavily doped P-type substrate and layer 42 is an N-type epitaxial layer. However, in some embodiments layer 42 may be formed as a well region within substrate 41, for example by doping a portion of substrate 41. Layer 42 generally has a peak doping concentration of about 1E15 to 1E18 atoms/cm³. FIG. 2 and FIG. 3 illustrate an embodiment of MOS gated SCR 28 that uses a plurality of transistor cells that are each formed as a stripe running across surface 43 of substrate 40, such as a transistor cell 37 and a transistor cell 38. Transistor cells 37 and 38, identified in a general manner by arrows, are connected together in parallel so that each cell operates as an MOS transistor and the interconnected group of cells function as a single large MOS transistor. Cell based transistors are well known to those skilled in the art. It is also well known to those skilled in the art that different geometrical structures, such as a circle or hexagon, may be used to form each of the cells instead of the stripe structure or alternatively, only one cell may be used.

Cell 37 includes a first doped region 47 that is formed as a stripe extending across surface 43. Region 47 generally has a conductivity type that is the opposite to that of layer 42 with a peak doping concentration of about 1E15 to 1E18 atoms/cm³. Within region 47, another doped region 48 is formed as a stripe extending coaxially with region 47. Region 48 generally has a conductivity type that is the opposite to the conductivity type of region 47 with a peak doping concentration of about 1E15 to 1E18 atoms/cm³. A doped region 50 is formed to extend through region 48 to contact region 47. Region 50 generally has the same conductivity type as region 47 with a higher peak doping concentration of about 1E17 to 1E19 atoms/cm³. Regions 47, 48, and 50 generally are formed to extend from surface 43 into substrate 40. Similarly, cell 38 includes a doped region 44 that is similar to region 47. Region 44 is formed as another stripe that extends parallel to region 47 and spaced apart a distance to support current flow through layer 42. A doped region 45 that is similar to region 48 is formed within region 44. As will be seen further hereinafter, regions 45 and 48 function as the source regions of the MOS transistor formed by cells 37 and 38, and regions 44 and 47 function as the body of the respective transistor cells. Doped region 50 provides a body contact for electrically contacting the body of region 47. As illustrated in FIG. 3, other body contacts, such as doped regions 51, 59, and 60 that are similar to region 50, are formed at various positions within regions 45 and 48 and extend through regions 45 and 48 to contact respective regions 44 and 47. Each of the body contacts of regions 50, 51, 59, and 60 are separated by a distance 76 as will be seen further hereinafter.

A first gate structure 55 is formed overlying a portion of region 48, a portion of region 45, and the portion of layer 42 that is therebetween. Gate structure 55 includes a gate dielectric 52 that is formed on surface 43 overlying a portion of region 48 and extending across a portion of region 47 and layer 42 to also overlie a portion of regions 44 and 45. A gate conductor 53, such as doped polysilicon or a silicon-metal alloy, is formed on dielectric 52. Another dielectric 54 is formed overlying conductor 53 and dielectric 52 in order to insulate conductor 53 from other conductors. A second gate structure 63 is formed overlying a portion of region 45 and a portion of region 44 that is on a side of region 44 opposite to gate structure 55. Gate structure 63 includes a gate dielectric 56, a gate conductor 57, and another dielectric 58 that are similar to respective dielectric 52, conductor 53, and dielectric 54. A portion of regions 44 and 47 near respective regions 45 and 48 and underlying gate structures 55 and 63 will form a channel region that facilitates current flow during a portion of the operation of the MOS transistor formed by cells 37 and 38.

Resistor 29 and diodes 26 and 27 may be formed on a dielectric 61 that is on surface 43. Forming resistor 29 and diodes 26 and 27 on dielectric 61 electrically isolates them from MOS gated SCR 28 which minimizes leakage current and reduces false triggering of MOS gated SCR 28. Resistor 29 may be formed on dielectric 61 as a semiconductor material 62. For example, material 62 may be formed by depositing polysilicon that is doped to a conductivity that provides the desired resistance for resistor 29. Alternately, doped or undoped polysilicon may be formed and then doped to the desired conductivity by implanting and activating the dopants. Diodes 26 and 27 may also be formed on dielectric 61 as a semiconductor material. For example, a layer of polysilicon may be formed on dielectric 61 and portions of the polysilicon doped to provide a first doped section 65, a second doped section 66, and a third doped section 64. Sections 64 and 65 are doped to have a conductivity type, such as N-type, that is opposite to that of section 66, such as P-type. Diodes 26 and 27 may also be formed by depositing a doped layer of polysilicon and counter doping a portion of the polysilicon to form either section 66 or sections 64 and 65. Dielectric regions or dielectrics 69 separate material 62 from sections 64-66. A dielectric layer could be applied to cover dielectric 61 and the structures formed thereon, and openings could be formed through the dielectric layer to provide electrical contact to material 62 and sections 64-66. A conductor material 71 generally is formed to electrically contact regions 48 and 45 in addition to regions 50, 51, 59, and 60 to provide electrical contact to the source and body regions of MOS gated SCR 28. A portion of conductor material 71 may be formed to overlie a portion of dielectric 69 and electrically contact one end of material 62 to form contact to one end of resistor 29. Another conductor material 72 may be formed to contact another end of material 62 and section 64 to form an electrical connection between resistor 29 and diode 27. Another conductor 73 can be formed to contact section 65 and surface 43 to provide an electrical connection between diode 26 and terminal 32.

Figure 4:
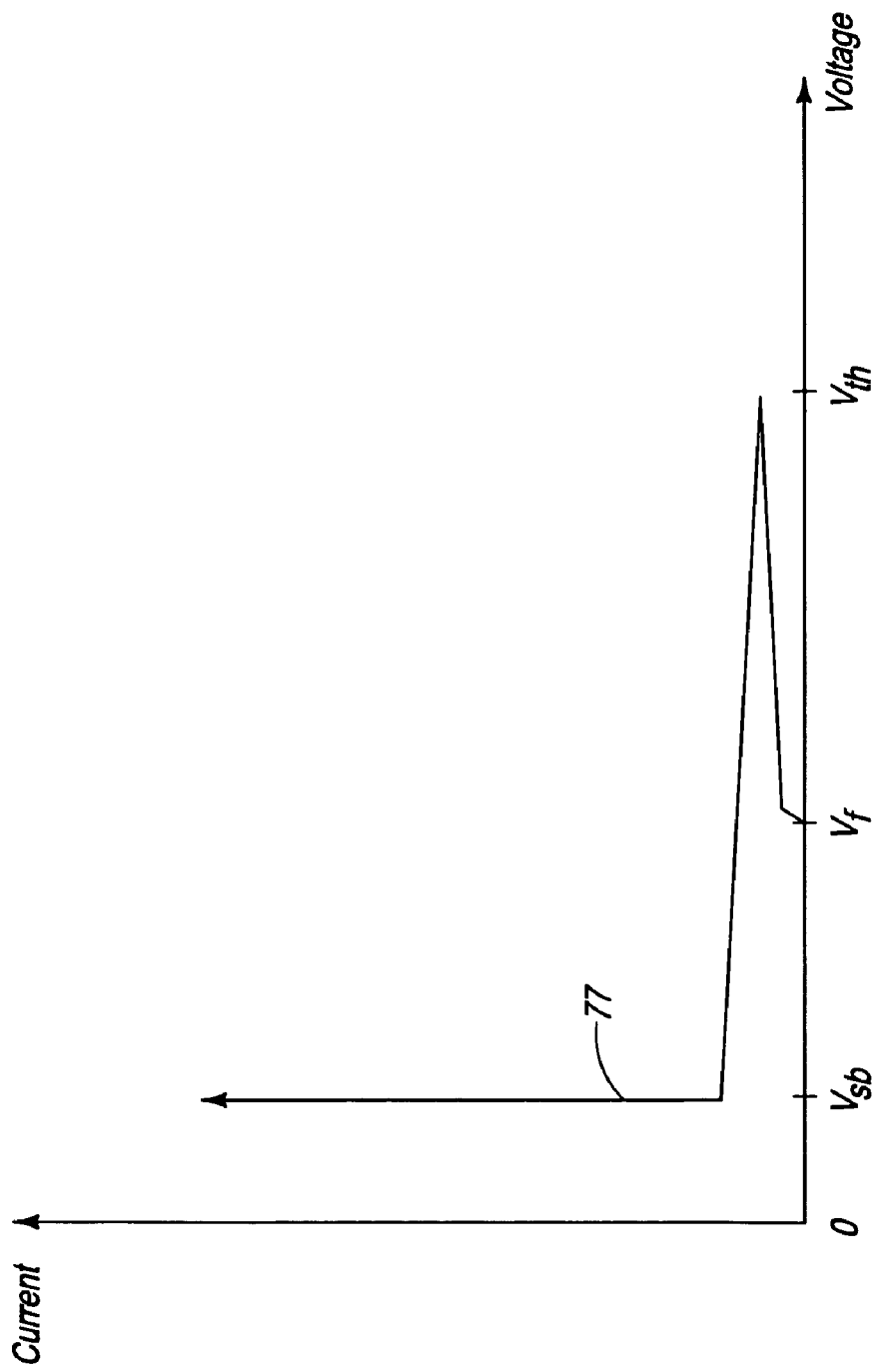
FIG. 4 is a graph having a plot illustrating the voltage-current characteristic of the shunt protection circuit of FIG. 1 in accordance with the present invention.

FIG. 4 is a graph having a plot 77 that illustrates the voltage-current characteristic of circuit 25. The abscissa indicates the voltage drop between terminals 32 and 33, and the ordinate indicates increasing value of the current through circuit 25. This description has references to FIGS. 1-4.

In normal operation, current source 13 (FIG. 1) provides current 14 that flows through LEDs 20-23 to return 12, and light is emitted by each of LEDs 20-23. Circuit 25 conducts substantially zero current during this time but the voltage across terminals 32 and 33 is substantially the forward voltage drop of the corresponding one of LEDs 20-23 as illustrated near point Vf of plot 77. The forward voltage drop of LEDs 20-23 typically is about 3.0 to 3.5 volts. If one of LEDs 20-23 fails as an open circuit, the voltage increases between terminals 32 and 33 of the corresponding parallel connected circuit 25. Diodes 26 and 27 are formed as back-to-back diodes to provide approximately equal forward and reverse breakdown voltages. Additionally, because of the back-to-back configuration, the breakdown voltage remains substantially constant over a wide temperature range. The breakdown voltage across diodes 26 and 27 is formed to be less than the breakdown voltage of MOS gated SCR 28 to ensure that current flows through diodes 26 and 27 before MOS gated SCR 28. Thus, the doping profiles of sections 64-66 are formed to provide such operation. When the voltage between terminals 32 and 33 is greater than the breakdown voltage across diodes 26 and 27, current 14 begins flowing through resistor 29 and forms a voltage at a node 30. When the voltage drop across resistor 29 is greater than the gate-to-source threshold voltage of the MOS transistor formed by cells 37 and 38, a channel is created within the portions of regions 44 and 47 that underlie gate structures 55 and 63, and current begins flowing from terminal 32 vertically through substrate 41 to the channel region formed in layer 42 underlying gate structures 55 and 63, to adjacent portions of regions 44 and 47, and through respective regions 45 and 48 to conductor material 71 and terminal 33. This current flow is illustrated by an arrow 67 in FIG. 2 and by plot 77 just to the right of point Vf.

A portion of the current flowing into regions 44 and 47 flows laterally through regions 44 and 47 until reaching the body contacts of regions 50, 51, 59, and 60. The current flowing laterally through regions 44 and 47 creates a voltage drop along the respective region between each body contact of regions 50, 51, 59 and 60. If the voltage becomes large enough so that the potential between regions 44 and 45 or between regions 47 and 48 is greater than the threshold voltage of the P-N junction (Vth) at the intersection of regions 44 and 45 or of regions 47 and 48, the P-N junction becomes forward biased as illustrated at a point Vth of plot 77. The forward biasing creates another current flow path, illustrated by arrows 68, from terminal 32 through substrate 41 and layer 42, and through the P-N junction of regions 44 and 45 and regions 47 and 48. Some of the current flowing through the P-N junctions also flows through regions 44 and 47 which maintains the voltage drop across the respective region and keeps the P-N junctions forward biased. The voltage drop across the P-N junctions is less than the breakdown voltage of diodes 26 and 27 so that the gate voltage of the MOS transistor remains below the gate-to-source threshold voltage, thus, the channel region collapses and all of the current flow is through the P-N junctions. Thus, once these P-N junctions are forward biased, MOS gated SCR 28 is latched on and the current flow continues through the P-N junctions until the current is interrupted externally to circuit 25. Additionally, the voltage drop across circuit 25 decreases to a value substantially equal to the threshold voltage of the P-N junction between regions 44 and 45 and regions 47 and 48 as illustrated by plot 77 at point Vsb.

The greater distance 76 becomes, the larger the lateral resistance through regions 44 and 47, thus, the lower the current flowing laterally through regions 44 and 47 has to be to reach the threshold voltage of the P-N junction (Vth). Distance 76 and the resistivity of regions 45 and 48 are selected to ensure that the voltage drop laterally across regions 44 and 47 is greater than the threshold voltage (Vth) of the P-N junctions for a desired value of current flow. It is believed that in order to ensure that the lateral voltage drop is greater than the threshold voltage of the P-N junctions, the total surface area of doped regions 50, 51, 59, and 60, within each doped region 45 and 48 should occupy no more than about twenty five percent of the total surface area of the portion of doped regions 45 and 48 that extends axially along regions 45 and 48 coextensively with respective regions 59/60 and 50/51 as illustrated by respective dashed lines 46 and 49. For example, for the illustrated portion of region 48, the total surface area of all regions 50 and 51 should be no greater than about twenty five percent of the total surface area of the portion of region 48 that extends laterally through regions 50 and 51 and has approximately the same width as regions 50 and 51 as illustrated by dashed lines 49. The total surface area of the portion of region 48 includes the surface area of regions 50 and 51. Those skilled in the art will appreciate that other geometric configurations of regions 45 and 48 would use a different definition to calculate the surface area ratio. For example, a transistor that uses circular shaped cells instead of stripe shaped cells may form contacts, such as contacts 50/51, in no greater than about twenty-five percent of the cells with the remaining cells not having contacts such as regions 50 and 51.

Forming circuit 25 to latch with a low voltage drop reduces the power dissipation within circuit 25 and also allows more than one circuit 25 to be operating without degrading the operation of LEDs 20-23. Additionally, the latching is reset when power is removed, thus, the defective LED may be replaced without replacing circuit 25 and system 10 will operate normally. Those skilled in the art will appreciate that circuit 25 may also be used to protect other types of current driven devices.

Figure 5:
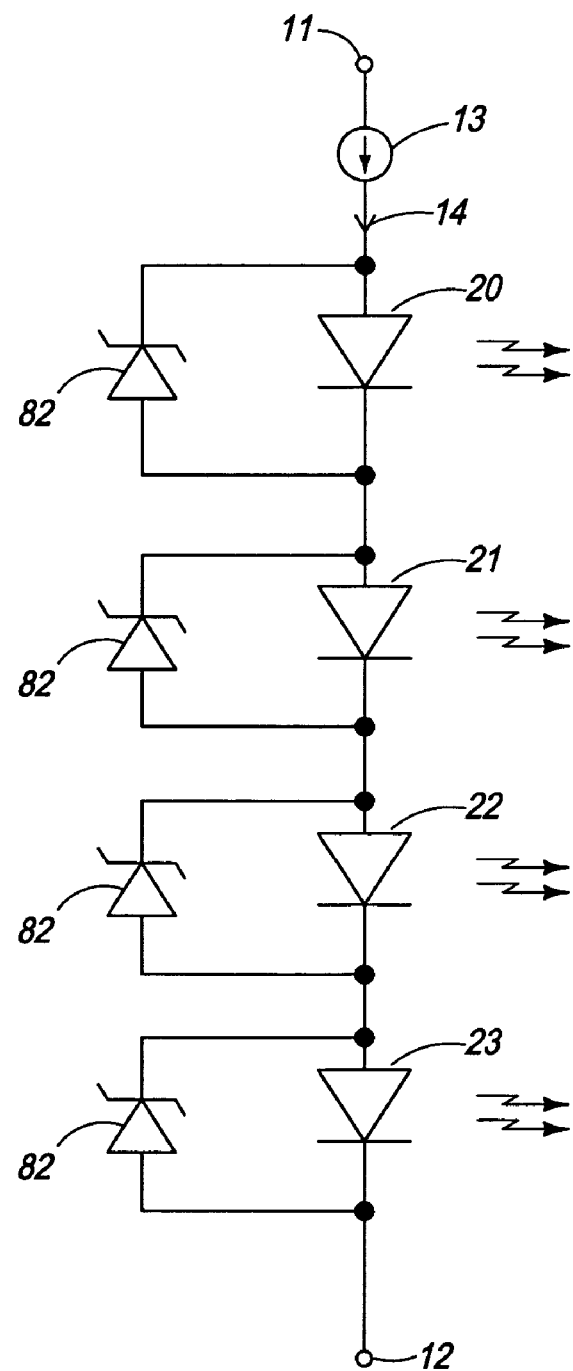
FIG. 5 schematically illustrates an embodiment of a portion of a LED system having another shunt protection circuit that is an alternate embodiment of the shunt protection circuit of FIG. 1 accordance with the present invention in accordance with the present invention.

FIG. 5 schematically illustrates an LED lighting system 80 that is an alternate embodiment of system 10 explained in the description of FIGS. 1-4. Circuit 82 facilitates operating system 80 when one of LEDs 20-23 fails in an open circuit condition. One shunt protection circuit 82 generally is connected in parallel with each of LEDs 20-23 so that circuit 82 conducts current 14 when the corresponding LED fails in an open circuit condition.

As is well known in the art, an LED generally is designed to provide a particular color and intensity of light when conducting a particular amount of current. The voltage drop across the LED generally is substantially constant for small variations of the current around the particular amount of current. Additionally, the LED generally has a maximum rated power dissipation that is specified at the nominally rated voltage drop across the LED and at the maximum rated current. For example, an LED that has a maximum rated current of about three hundred fifty (350) milli-amperes may have a nominal rated voltage drop of about 3.5 V and would typically have a maximum power dissipation of about 1.2 watts at the maximum rated current. The maximum rated power dissipation of the LED once it is assembled into an LED package may be approximately 1.5 watts. Another LED having a maximum rated current of about five hundred (500) milli-amperes may have the same rated voltage drop and the maximum power dissipated by the LED would increase to about 1.75 watts. The maximum rated power dissipation once the LED is assembled into an LED package may be approximately two (2.0) watts. Typically, current 14 is selected to be less than the maximum rated current.

Circuit 82 is a semiconductor die that is assembled into a semiconductor package. Circuit 82 is selected to have a breakdown voltage that is greater than the forward voltage drop across LED 20. Thus, when LED 20 is operating, circuit 82 is not operating and has substantially no power dissipation, although there may be a small amount due to some leakage current. Circuit 82 is also selected so that the maximum rated power dissipation of the semiconductor die packaged in the semiconductor package is less than the maximum rated power dissipation of the LED connected in parallel with circuit 82. Typically, the maximum rated power dissipation of circuit 82 is no greater than about one-fourth (¼) the maximum rated power dissipation of the LED, and preferably is no greater than about one tenth (1/10).

When one of LEDs 20-23 fails in an open circuit condition, a voltage is dropped across circuit 82. The breakdown voltage of circuit 82 is selected to be less than the open circuit voltage provided by source 13 minus the voltage drop across the other LEDs 20-23 but greater than the forward voltage of the corresponding LED that has the open circuit. Thus, this open circuit voltage enables circuit 82 to conduct current 14. Because the breakdown voltage of circuit 82 is greater than the forward voltage drop across the corresponding LED and the value current 14 is the same, the power dissipated within circuit 82 exceeds the maximum rated power of circuit 82.

The semiconductor of circuit 82 is selected to fail in a shorted condition when the power dissipated within circuit 82 exceeds the maximum rated power dissipation of circuit 82. The high power dissipation causes the temperature of circuit 82 to continually increase until circuit 82 fails and becomes a short circuit. When the semiconductor die within the package of circuit 82 is shorted, the resistance is very low, thus, the voltage drop across circuit 82 becomes very small. The resistance usually drops to less than about ten (10) ohms and preferably less than about three ohms. The voltage drop across circuit 82 usually drops to less than the forward drop across the corresponding LED and preferably to about 0.4 to 1.5 volts. The corresponding power dissipation within circuit 82 after the shorted condition occurs is also very small and is less than the power dissipation of the corresponding LED when the LED is operating normally. As can be seen from the foregoing, the power dissipation within circuit 82 after the shorted condition occurs is also much less than the power dissipation of prior art devices used to protect LEDs such as a zener diode conducting the same current. Such power dissipation of circuit 82 is also believed to be less than a silicon controlled rectifier (SCR) that is in a conducting state at the same current flow. Thus, circuit 82 forms an alternate path for current flow around the open circuit of the LED and has very low power dissipation.

Using circuit 82 that fails in a shorted condition provides an unexpected result that is contrary to the conventional design practices of one of ordinary skill in the art. Skilled artisans generally do not use circuits that have a maximum rated power dissipation that is less than the power that is expected to be dissipated by a protection device. Thus, using circuit 82 that has a maximum rated power dissipation that is less than the power that is expected to be dissipated within circuit 82 provides an unexpected result of protecting system 80. Using shunt protection circuit 82 to protect system 80 provides low cost and low power dissipation.

The semiconductor die within circuit 82 usually is selected to be a semiconductor die that fails to a shorted condition after the power dissipated within circuit 82 is more than the maximum rated power dissipation of circuit 82. It is believed that the P-N junction of the semiconductor die fails to a shorted condition which destroys the semiconductor action of the P-N junction but allows conduction through the semiconductor device. It is possible that the power dissipated by circuit 82 just after the LED becomes an open circuit may cause metal migration into the semiconductor die of circuit 82 that destroys the semiconductor junction properties but provides a conductive path through the semiconductor die. It is also important that the bonding wires, or other connection method used within circuit 82, be able to conduct current 14 without damaging the bonding wires. Suitable semiconductor devices that fail in a shorted condition include a zener diode assembled in a package that has a maximum power dissipation rating of no greater than about two hundred milli-watts (200 mw). Other suitable semiconductor devices include a diode, and a transient voltage suppressor (TVS). One suitable package is referred to in the industry as a SOT-23 type package. Another suitable semiconductor device includes a multiple junction semiconductor device, such as a bipolar transistor or a MOSFET, that is biased to have a high impedance below a certain threshold voltage and to have a low impedance after the threshold voltage is reached. Such a transistor usually would include a reference circuit to set the breakdown voltage which could be a gate threshold voltage or a zener diode. Such a semiconductor device would also be assembled in a package that has a maximum power dissipation rating of no greater than about one hundred fifty milli-watts (150 mw), such as a SOD-23 type package. Those skilled in the art will appreciate that circuit 82 may also be used to protect other types of current driven devices.

In view of all of the above, it is evident that a novel device and method is disclosed. Included, among other features, is forming an MOS gated SCR circuit that latches in a low resistance state and provides a low resistance alternate conduction path that consumes substantially no power during normal operation of the circuit that is protected. Also provided is using a semiconductor device that has a rated power dissipation that is less than the maximum power that is to be dissipated within the semiconductor device. Using a semiconductor device that fails in a shorted condition also provides a low resistance alternate conduction path that protects the system in which it is used. Such a semiconductor device also is smaller and minimizes false triggering.

While the subject matter of the invention is described with specific preferred embodiments, it is evident that many alternatives and variations will be apparent to those skilled in the semiconductor arts. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A shunt protection circuit method comprising:
coupling a first semiconductor device having a first maximum rated power dissipation in parallel with a second semiconductor device having a second maximum rated power dissipation wherein the first maximum rated power dissipation of the first semiconductor device is less than the second maximum rated power dissipation and wherein the first maximum rated power dissipation is less than an amount of power that will be dissipated within the first semiconductor device upon the second semiconductor device failing in an open condition wherein the amount of power causes the first semiconductor device to fail in a shorted condition.

2. The method of claim 1 wherein coupling the first semiconductor device includes coupling the first semiconductor device in parallel with an LED.

3. The method of claim 1 wherein coupling the first semiconductor device includes coupling a zener diode in parallel with the second semiconductor device.

4. The method of claim 3 wherein coupling the zener diode in parallel with the second semiconductor device includes coupling ft the zener diode having the first maximum rated power dissipation that is less than approximately one tenth of the second maximum power dissipation.

5. The method of claim 3 wherein coupling the zener diode in parallel with the second semiconductor device includes coupling the zener diode having the first maximum rated power dissipation that is less than approximately one fourth of the second maximum power dissipation.

6. The method of claim 1 wherein coupling the first semiconductor device includes coupling a zener diode in parallel with an LED.

7. The method of claim 6 wherein coupling the zener diode in parallel with the second semiconductor device includes coupling the zener diode having the first maximum rated power dissipation that is less than the second maximum rated power dissipation of the LED.

8. The method of claim 1 wherein coupling the first semiconductor device includes coupling the first semiconductor device that is packaged in one of an SOT-23 or SOD-23 type of package.

9. A method of forming a protection circuit comprising:
forming the protection circuit having first and second connection terminals suitable for coupling across a second circuit external to the protection circuit; and
configuring the protection circuit to have a first power dissipation responsively to the second circuit operating in a normal mode, a second power dissipation for a first time period after the second circuit fails in an open condition, and a third power dissipation after the first time period is complete wherein the third power dissipation is less than the second power dissipation and is also less than a power dissipation of the second circuit while the second circuit is operating in the normal mode.

10. The method of claim 9 wherein configuring the protection circuit to have the first power dissipation includes forming an MOS gated SCR having an MOS transistor with no greater than twenty-five percent of an area of source regions of the MOS transistor occupied by contacts to a body region of the MOS transistor.

11. The method of claim 10 wherein forming the MOS gated SCR having the MOS transistor includes forming a first doped region of a first conductivity type on a semiconductor substrate of a second conductivity type, forming a second doped region of the second conductivity type within the first doped region as the body region, forming a third doped region of the first conductivity type within the second doped region, and forming a third doped region extending through the second doped region as a contact to the body region.

12. The method of claim 9 wherein configuring the protection circuit to have the first power dissipation includes providing a semiconductor device having a maximum rated power dissipation that is less than an amount of power that must dissipated by the protection circuit for the first time period after the second circuit fails in the open condition.

13. The method of claim 12 wherein providing the semiconductor device having the maximum rated power dissipation that is less than the amount of power that must dissipated for the first time period includes providing the semiconductor device that fails in a shorted condition as a result of dissipating the amount of power.

14. The method of claim 12 wherein providing the semiconductor device having the maximum rated power dissipation that is less than the amount of power that must dissipated for the first time period includes providing the semiconductor device that has a maximum rated power dissipation that is less than approximately one fourth of the second power dissipation.

15. The method of claim 9 wherein configuring the protection circuit having first and second connection terminals suitable for coupling across a second circuit includes configuring the protection circuit having first and second connection terminals suitable for coupling across an LED.

16. A method of protecting an LED comprising:
providing an LED having a first maximum rated power dissipation; and
coupling an MOS gated SCR in parallel with the LED.

17. A method of protecting an LED comprising:
providing an LED having a first maximum rated power dissipation; and
coupling a semiconductor device in parallel with the LED wherein the semiconductor device has a second maximum rated power dissipation that is less than the first maximum rated power dissipation.

18. The method of claim 17 wherein coupling the semiconductor device in parallel with the LED includes coupling a semiconductor die that is assembled into a semiconductor package wherein the semiconductor device has a maximum rated power dissipation that is less than an amount of power that will be dissipated within the LED during normal operation of the LED.

19. The method of claim 1 wherein coupling the semiconductor device in parallel with the LED includes coupling one of a diode, a zener diode, a MOSORB, or a TVS.

* * * * *